United States Patent

Ploessl et al.

[11] Patent Number: 5,907,771
[45] Date of Patent: May 25, 1999

[54] REDUCTION OF PAD EROSION

[75] Inventors: Robert Ploessl, Glen Allen, Va.;
Bertrand Flienter, Hopewell Junction, N.Y.

[73] Assignee: Siemens Aktiengesellschaft, Munich, Germany

[21] Appl. No.: 08/940,233

[22] Filed: Sep. 30, 1997

[51] Int. Cl.$^6$ ................................................. H01L 21/8242
[52] U.S. Cl. ............................ 438/243; 438/692; 438/700
[58] Field of Search .................................... 438/243–249, 438/386–390, 690–702

[56] References Cited

U.S. PATENT DOCUMENTS 4,939,104  7/1990  Pollack et al. .
5,380,674  1/1995  Kimura et al. .

*Primary Examiner*—Jey Tsai
*Attorney, Agent, or Firm*—Stanton C. Braden

[57] ABSTRACT

Improved technique of forming trench capacitors without causing excessive erosion at the edges of the array region resulting from polishing. The erosion is reduced by providing a block mask to protect the array region while partially removing a portion of the hard mask used to etch the trenches in the field region. The partial etch equalizes the height of the hard mask in the array and field region after formation of the deep trenches by a reactive ion etch.

21 Claims, 5 Drawing Sheets

REDUCTION OF PAD EROSION

FIELD OF THE INVENTION

The invention relates to semiconductor fabrication in general and, more particularly, to the reduction of pad film erosion.

BACKGROUND OF THE INVENTION

In the fabrication of integrated circuits (ICs) or chips, features are created by etching into the silicon substrate. These features are used to form devices. A deep trench (DT), for example, serves as a trench capacitor of a memory cell. Typically, in the process for forming a random access memory (RAM) integrated circuit (IC) or chip, an array of deep trenches are etched in the array region of the substrate. Trench capacitors are then formed from the trenches. Such trench capacitors are used to create an array of memory cells, which are interconnected by wordlines and bitlines to form a memory IC.

FIGS. 1a–1d show a portion of a process for forming the array of trench capacitors. As shown in FIG. 1a, a conventional pad stack 110 is formed on the surface of a substrate 101. The pad stack includes, for example, sequential layers of a pad oxide 112, a pad nitride 114, and a pad hard mask 116 such as TEOS. A layer of photoresist (not shown) is deposited over the pad stack and patterned to selectively expose areas of the pad stack in the array region where the DTs are to be formed. The substrate is then etched by a reactive ion etch (RIE).

The RIE erodes the pad TEOS layer at a greater rate in the array region 135 than the non-array (field) region 130, creating topography. That is, there exists a large step in height between the field and array regions. Subsequently, at least after formation of a node dielectric, the trenches are filled with, for example, heavily doped polysilicon (poly) 150. Since the poly is conformal, the topography created during RIE is transferred to the poly layer as well.

In FIG. 1b, a chemical mechanical polish (CMP) is performed to provide a planar surface. The CMP is selective to the hard mask layer, removing the poly without effectively removing the pad TEOS. As can be seen, the CMP erodes the poly in the array region, causing a depression to form therein. This is referred to as dishing. Due to the large step that exists, poly residuals remain at the edges 160 of the array after CMP. After stripping the pad TEOS layer as shown in FIG. 1c, poly "ears" 165 protrude above the pad nitride layer in the Dts. Because of the poly residuals remaining in the edge during the previous CMP step as a result of the topography, the height of the ears at the array edge are higher than those in the middle or plateau portion 162. For example, height at the edge can be >2500Å and the plateau can rage from 0 to 1500Å. A touch up CMP is required to remove the poly ears. However, as shown in FIG. 1d, the touch up CMP causes erosion of the pad nitride layer in the array region. Further, the pad nitride erosion is more pronounced at the edge than at the plateau portion of the array region. Such erosion is detrimental since it causes variations in gate threshold voltage and increases buried strap resistance, adversely affecting yield.

As apparent from the foregoing discussion, it is desirable to provide an improved pad stack for use in etching DTs.

SUMMARY OF THE INVENTION

The invention relates to fabrication of integrated circuits. In particular, the invention provides an improved technique for forming deep trenches. In one embodiment, a block mask is used to protect the array region while an etch is performed to remove a portion of the hard mask. The depth of the field etch is equal to about the amount of material that is eroded in the array region by the reactive ion etch that forms the deep trenches. As a result, the hard mask is about the same height in both the array and field regions after the formation of the deep trenches.

DETAILED DESCRIPTION OF THE INVENTION

The invention relates to the fabrication of ICs. Typically, a plurality of ICs are processed in parallel on a semiconductor substrate such as a silicon wafer. Other types of semiconductor wafers are also useful. The wafer is diced after forming the ICs, separating them into individual chips. The chips are then packaged and integrated into, for example, consumer products. Such consumer products include, for example, personal computers, cellular phones, and other electronic products.

For purposes of discussion, the invention is described in the context of forming a portion of a chip. In particular, the invention is described in the context of forming trench capacitors employed in memory cells such as DRAM cells. However, the invention is applicable to the fabrication of ICs in general, including random access memories (RAMs), dynamic RAMs (DRAMs), synchronous DRAMs (SDRAMs), and static RAMs (SRAMs). Other ICs include logic devices such as programmable logic arrays, application specific ICs (ASICs), and merged logic-DRAMs (embedded DRAMs).

Figure 2:
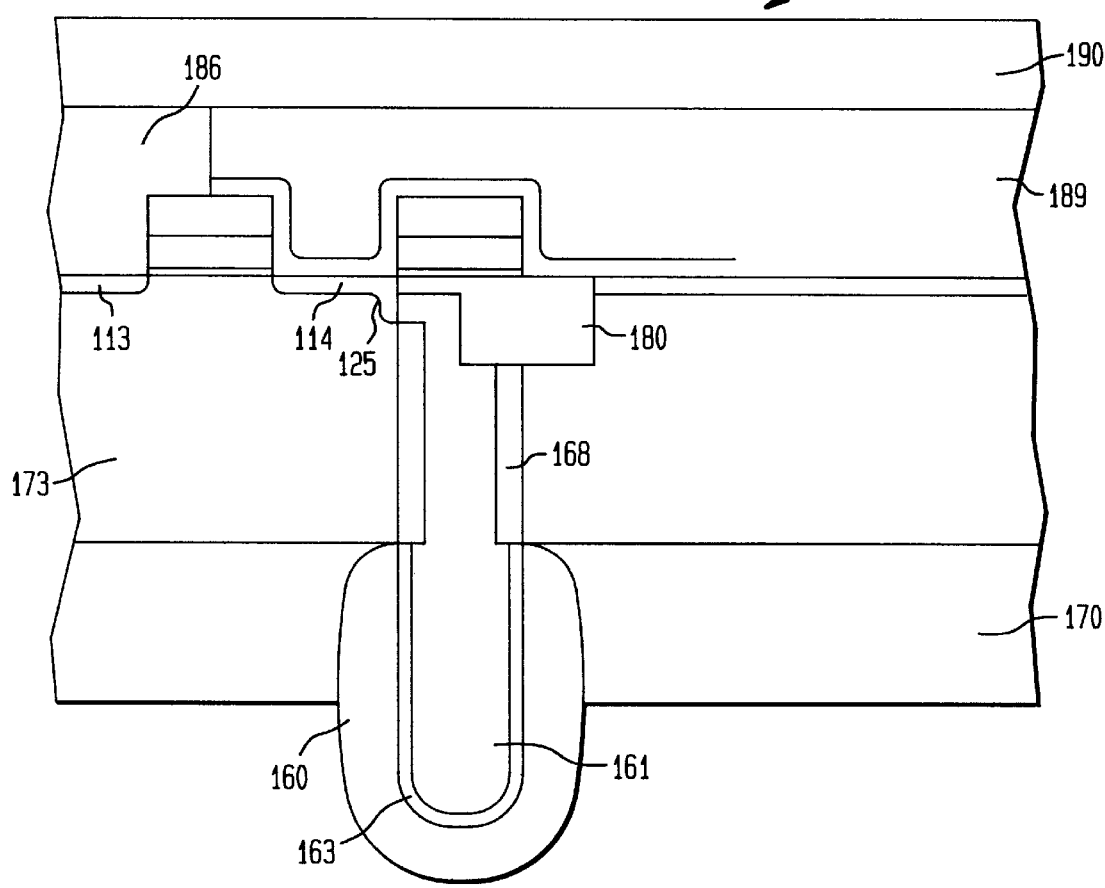
FIG. 2 shows a trench capacitor DRAM cell.

Referring to FIG. 2, a trench capacitor DRAM cell is shown. Such DRAM cell is described in, for example, Nesbit et al., *A 0.6 $\mu m_2$ 256 Mb Trench DRAM Cell With Self-Aligned Buried Strap (BEST)*, IEDM 93–627, which is herein incorporated by reference for all purposes. As shown, the DRAM cell includes a trench capacitor 160 formed in a substrate 101. The trench is filled with, typically, polysilicon (poly) 161 that is heavily doped with n-dopants. The poly serves as one plate of the capacitor, is referred to as a "storage node." A buried plate 165 doped with n-type dopants surrounds the lower portion of the trench. In the upper portion of the trench is a collar 168 for reducing parasitic leakage. A node dielectric 163 separates the two plates of the capacitor. A buried well 170 comprising n-type dopants is provided to connect the buried plates of the DRAM cells in the array. Above the buried well is a p-well 173. The p-well serves to reduce vertical leakage.

The DRAM cell also comprises a transistor 110. The transistor includes a gate 112 and diffusion regions 113 and 114 comprising n-type dopants. The diffusion regions are referred to as the source and drain. The designation of source and drain depends on the operation of the transistor. Connection of the transistor to the capacitor is achieved via a diffusion region 125, referred to as the "node diffusion". The gate stack, also referred to as the "wordline," typically comprises poly and nitride layers. Alternatively, a polycide layer which comprises silicide, such as molybdenum ($MoSi_x$), tantalum ($TiSi_x$), tungsten ($WSi_x$) titanium ($TiSi_x$), or cobalt ($CoSi_x$), may be disposed over a layer of poly to reduce wordline resistance. In one embodiment, the polycide layer comprises $WSi_x$ over poly. A nitride liner covers the gate stack and substrate. The nitride layer and nitride liner serves as an etch or polish stop layer for subsequent processing.

A shallow trench isolation (STI) 180 is provided to isolate the DRAM cell from other cells or devices. A wordline 15 formed over the trench and isolated therefrom by the STI. Such a wordline is referred to as the "passing wordline". Such configuration is referred to as a folded bitline architecture.

An interlevel dielectric layer 189 is formed over the wordlines. A conductive layer, representing a bitline, is formed over the interlevel dielectric layer. A bitline contact opening 186 is provided in the interlevel dielectric layer to contact the source 113 to the bitline 190.

A plurality of such cells is configured in an array. The array of cells is interconnected by wordlines and bitlines. Access to a cell is achieved by activating the cell's corresponding wordline and bitline.

Figure 3A:
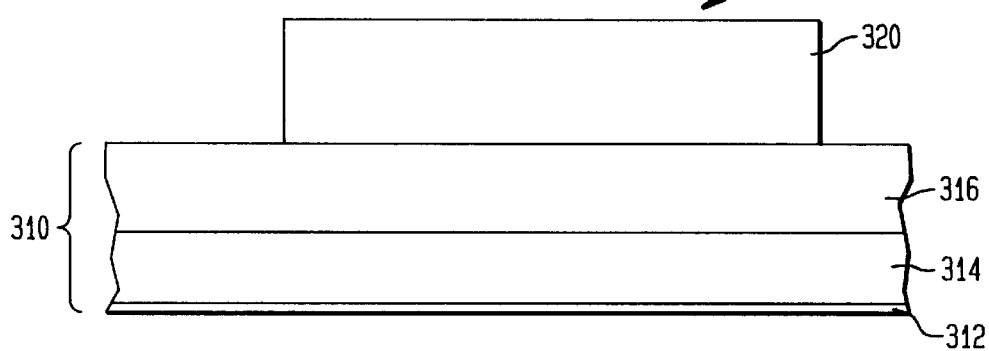
FIGS. 3a–3f show a process of forming deep trenches in accordance with one embodiment of the invention.

FIGS. 3a–e show a process of forming an array of trench capacitors. Referring to FIG. 3a, a substrate 301 is provided in which the trench capacitors are formed. The substrate, for example, is a silicon wafer. Other semiconductor substrates, such as gallium arsenide, germanium, silicon on insulator (SOI), or other semiconductor materials, are also useful. The substrate, for example, may be lightly or heavily doped with dopants of a pre-determined conductivity to achieve the desired electrical characteristics.

A pad stack 310 is formed on the surface of the substrate. The pad stack includes, for example, a pad oxide layer 312 formed on the surface of the substrate. The pad oxide is formed by, for example, thermal oxidation. The pad oxide is sufficiently thick to reduce stress and promote adhesion between a pad etch stop layer with the substrate.

Above the pad oxide is provided a pad etch stop layer 314. The pad etch stop layer should have sufficient selectivity to the material used to fill the trenches. In one embodiment, the pad etch stop layer comprises silicon nitride ($Si_3N_4$) due to its relatively low etch rate to the polysilicon used to fill the trenches. Typically, the etch selectivity between the poly and etch stop layers us about 60:1. For polishing, the selectivity is about 300:1. The nitride layer is formed by, for example, low pressure chemical vapor deposition (LPCVD). Other techniques for depositing the nitride layer are also useful. Typically, the pad nitride layer is about 200 nm.

Above the pad nitride is formed a hard etch mask layer 316. The hard etch mask comprises a material that is sufficiently dense or hard to withstand the ion bombardments of RIE during the formation of deep trenches. The thickness of the hard mask layer should be sufficient to prevent the deep trench etch from exposing the nitride layer. Further, the etch mask should have a higher wet etch rate than that of the pad etch stop layer. Typically, the selectivity is greater than about 80. In one embodiment, the first hard mask layer comprises undoped silicate glass such as TEOS. Other hard mask materials, such as boron doped silicate glass (BSG) or flowable oxide, are also useful.

In accordance with the invention, a mask layer is deposited on the pad stack. The mask layer is patterned to create a block 320 that covers an array region of the substrate in which deep trenches are to be created. The block serves as an etch mask to protect the pad stack in the array region from being etched. In one embodiment, the mask layer comprises a resist material. The resist is patterned by selectively exposing the resist with an exposure source and a mask containing the desired pattern. The resist is then developed to remove either the exposed or unexposed portions depending on whether a positive or negative resist is used, resulting in the formation of the block mask 320.

Figure 3B:
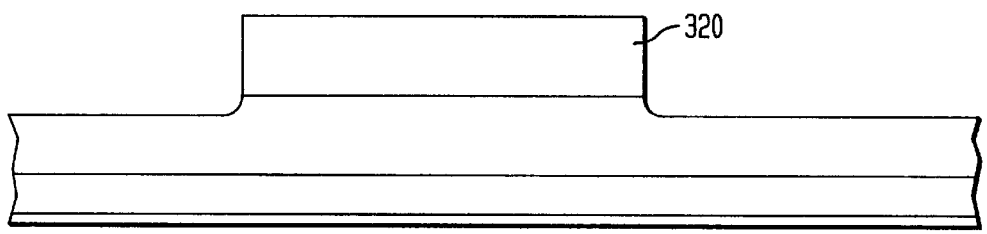

Referring to FIG. 3b, the mask layer in regions unprotected by the block mask is partially removed. Removal of the mask layer can be achieved by an RIE. Other etch techniques are also useful. The unprotected regions represent field regions of the substrate. In one embodiment, the depth of the etch is substantially equal to about the amount of height differential of the mask layer between the array and field regions after the DT etch as a result of the different erosion rates between the two regions. Typically, the depth of the etch is about 8 nm. Of course, the actual depth of the field etch may vary depending on the erosion rate differential of the mask layer between the field and array regions. The block mask is removed after the partial field etch of the mask layer.

Figure 3C:
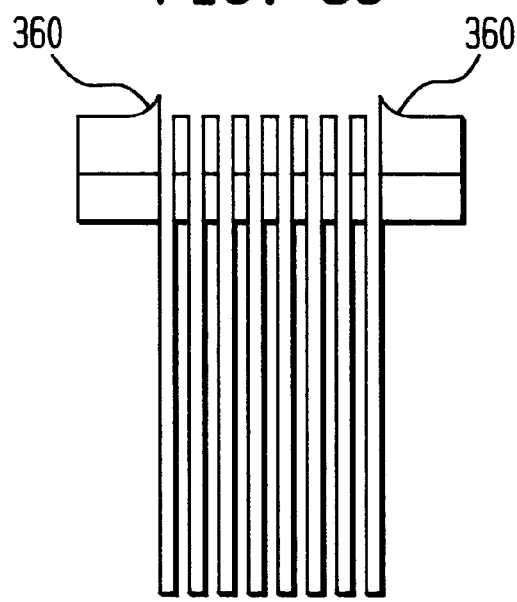

Referring to FIG. 3c, the pad stack is patterned using conventional lithographic techniques. Such techniques include depositing a photoresist layer over the pad stack and selectively exposing it with an exposure source and mask. Depending on whether a positive or negative resist is used, either the exposed or unexposed portions of the resist layer are removed during development, leaving regions of the pad stack unprotected. The unprotected regions correspond to areas where trenches are to be formed.

An etch, such as a reactive ion etch (RIE), is performed to create openings in the pad stack in regions unprotected by the resist. The openings expose the substrate below. A RIE then etches the substrate to create the DTs. The RIE erodes the pad mask in the array region. Since the pad mask in the field region has been partially etched to mask the excess erosion of the mask layer in the array region, the top surfaces of the pad mask in the field and array regions are substantially co-planar after the DT etch.

As shown, ears 360 of the mask layer that are relatively small in height protrude above the pad mask at the array edge. The width of these features depends on the actual shape of the field etch blocking mask.

Optionally, diffusion regions surrounding the lower portion of the trenches are formed, serving as buried plates. Formation of the buried plates is achieved by various known techniques such as providing a source from which dopants diffuse into the substrate. Node dielectric of the capacitors is then formed in the trenches.

Figure 3D:
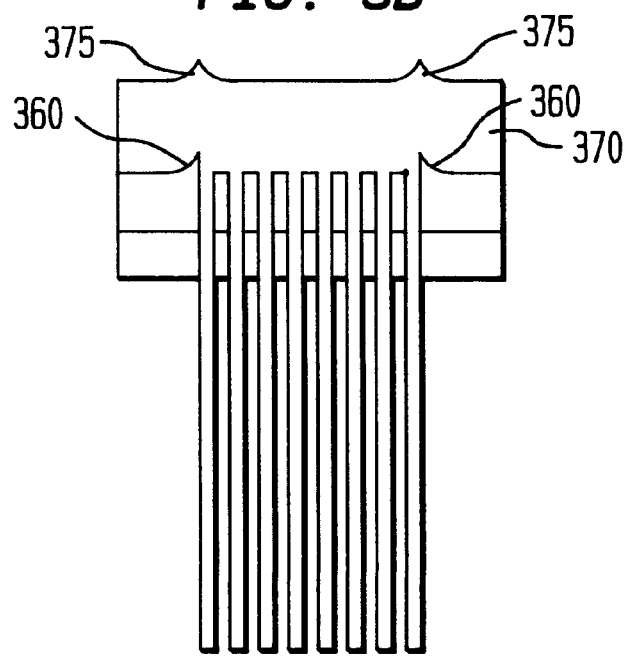

Referring to FIG. 3d, poly 370 is deposited to fill the trenches. To ensure completely filling the trenches, the poly overfills the trench, resulting in excess poly that covers the surface of the substrate. Since poly is conformal, the ears 375 are present on the surface of the poly layer as a result of ears 360 on the mask layer below. Since ears 260 are relatively small in height, ears 370 are also relatively small in height.

Figure 3E:
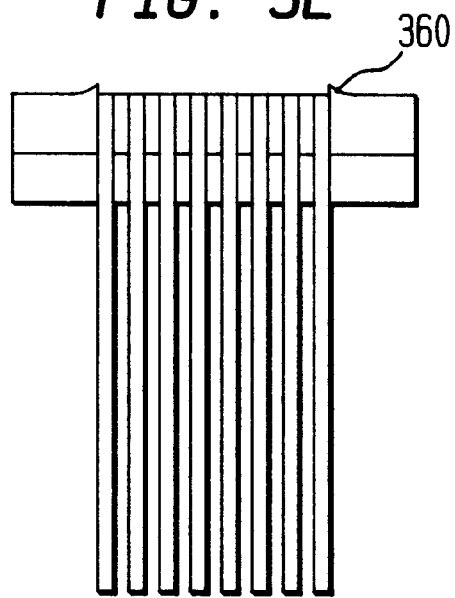

Referring to FIG. 3e, the excess poly is polished by, for example, CMP. The CMP is selective to the mask layer, removing the poly and using the mask layer as a stop layer. Since the field-array topography is avoided due to the partial field etch, the CMP is able to remove the poly without leaving any residuals at the edge of the array.

Figure 1A:
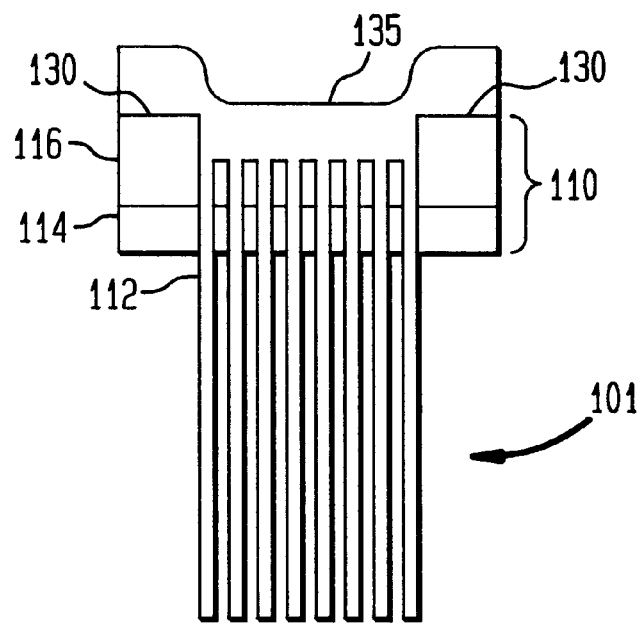
FIGS. 1a–1d show a conventional process of forming deep trenches.
Figure 1B:
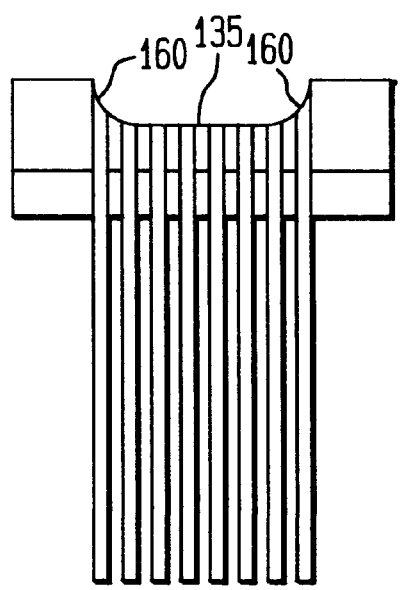
Figure 1C:
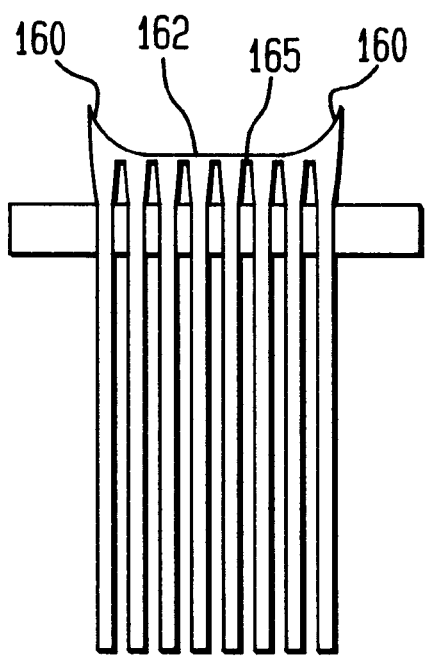
Figure 1D:
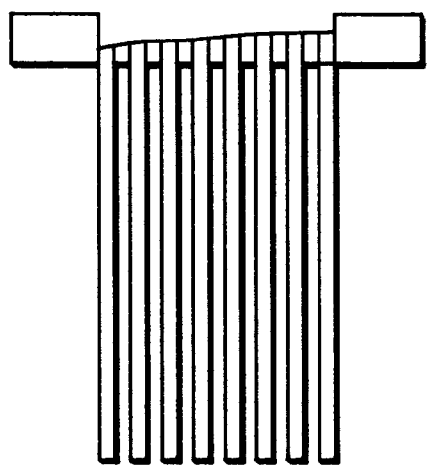
Figure 3F:
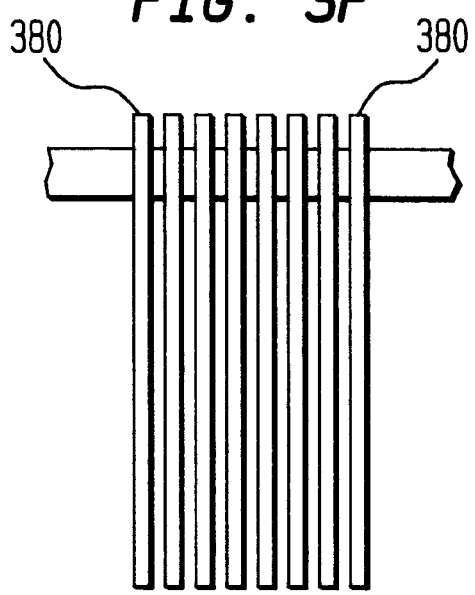

In FIG. 3f, the mask layer is removed by, for example, a wet etch. The wet etch is selective to the nitride and poly. The wet etch results in poly ears protruding above the surface of the nitride-layer. Since the previous CMP process avoids leaving poly residuals, the height of the poly layers are substantially equal throughout the array regions. This advantageously eliminates the need of a touch up CMP process. The poly ears are removed by an anisotropic etch used to recess the poly in the trenches to form the collar. As such, erosion of the pad nitride, as shown in FIG. 1d is avoided, resulting in improved yields.

At this point, an etch such as an RIE is performed to recess the poly in the trenches to form a dielectric collar therein. After the formation of the collar, the remaining portion of the DRAM is fabricated using conventional techniques, such as those described in Nesbit et al., *A 0.6 µm256 Mb Trench DRAM Cell With Self-Aligned Buried Strap (BEST)*, IEDM 93–627, which is already herein incorporated by reference for all purposes. This includes, for example, filling the trenches, forming buried straps, defining isolation regions to form the STIs, depositing the various layers comprising the gate stack and patterning these layers to form the gate conductors that represent wordlines, depositing an interlevel dielectric layer, creating contact openings, and forming bitlines.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

We claim:

1. In the fabrication of an integrated circuit, a method of reducing excessive erosion comprising:
    providing a substrate with a pad stack formed thereon, the pad stack comprising a hard mask layer over a etch stop layer, the substrate including a first region where an array of trench capacitors are to be formed and a second region outside of the first region;
    forming a block mask to protect the first region;
    partially etching the hard mask layer in the second region, the first region being protected by the block mask during the partial etch;
    removing the block mask;
    patterning the pad stack to expose portions of the substrate in the first region where the array of deep trenches are to be formed;
    etching the substrate to form the deep trenches, wherein the etching to form the deep trenches erodes the hard mask layer in the first region at a greater rate than the second region, the etching to form the deep trenches resulting in the hard mask layer having a substantially planar surface in the first and second regions as a result of the partial etching of the hard mask layer in the second region;
    filling the deep trenches with a material to form the storage node of the trench capacitors; and
    polishing to remove the excess material to expose the hard mask layer.

2. The method of claim 1 wherein said material employed to fill said deep trenches represents polysilicon.

3. The method of claim 2 wherein said integrated circuit represents a dynamic random access (DRAM) memory circuit.

4. The method of claim 1 wherein said polishing represents chemical mechanical polish (CMP).

5. The method of claim 1 wherein said etch stop layer is formed of silicon nitride.

6. The method of claim 5 wherein said hard mask layer is formed of a hard mask material selected from the group consisting of TEOS, boron-doped silicate glass (BSG), and flowable oxide.

7. A method for fabricating an integrated circuit on a semiconductor substrate, said method comprising:
    depositing a mask layer on a pad stack disposed above said semiconductor substrate;
    patterning said mask layer to create a block mask over a first region of said pad stack such that said pad stack has said first region covered by said block mask and a second region not covered by said block mask;
    etching, as a first etching step, said second region of said pad stack partially, thereby forming a first topography in said pad stack whereby an upper surface of said first region is higher than an upper surface of said second region;
    removing said block mask; and
    creating a device feature, including etching, as a second etching step, in said first region to create a trench in said semiconductor substrate, a presence of said first topography prior to said second etching step reducing a height differential between said upper surface of said first region and said upper surface of said second region in said pad stack after said second etching step, said height differential being caused by said second etching step having a tendency to etch faster through said first region than through said second region.

8. The method of claim 7 wherein said a depth of said first etching step is substantially equal to an amount of height differential in said pad stack between said upper surface of said first region and said upper surface of said second region if said second etching step had been performed without first performing said first etching step.

9. The method of claim 7 wherein said upper surface of said first region and said upper surface of said second region are substantially co-planar after said second etch step.

10. The method of claim 7 wherein said trench represents a deep trench configured to form a storage device of said integrated circuit.

11. The method of claim 7 wherein said creating said device feature further comprising:
    depositing polysilicon into said trench;
    performing chemical mechanical polish (CMP) on said polysilicon to remove excess polysilicon above said pad stack; and
    removing at least a portion of said pad stack after said CMP.

12. The method of claim 11 wherein said pad stack includes a pad oxide layer disposed above said semiconductor substrate, a pad etch stop layer disposed above said pad oxide layer, and a hard mask layer disposed above said pad etch stop layer.

13. The method of claim 12 wherein said pad etch stop layer represents a silicon nitride layer.

14. The method of claim 13 wherein said hard mask layer is sufficiently thick to prevent said first etching step from exposing said nitride layer.

15. The method of claim 14 wherein said hard mask layer is formed of a hard mask material selected from the group consisting of TEOS, boron-doped silicate glass (BSG), and flowable oxide.

16. The method of claim 13 wherein said nitride layer has a selectivity greater than about 80:1 to said hard mask layer during a wet etch employed to remove said hard mask layer.

17. The method of claim 16 wherein polysilicon ears remaining after said wet etch is removed during a subsequent polysilicon recess step, said polysilicon recess step being configured to form a collar within said trench.

18. The method of claim 17 wherein said wet etch is also selective toward said polysilicon.

19. The method of claim 7 wherein said trench represents a deep trench configured to form a trench capacitor.

20. The method of claim 7 wherein said integrated circuit represents a dynamic random access memory (DRAM) circuit.

21. A method for fabricating a dynamic random access memory (DRAM) integrated circuit on a semiconductor substrate, said method comprising:

depositing a mask layer on said pad stack, said pad stack including a pad oxide layer disposed above said semiconductor substrate, a pad etch stop layer disposed above said pad oxide layer, and a hard mask layer disposed above said pad etch stop layer;

patterning said mask layer to create a block mask over a first region of said hard mask layer such that said pad stack has said first region covered by said block mask and a second region not covered by said block mask, said first region representing an array region of said DRAM, said second region representing a field region of said DRAM;

etching partially, as a first etching step, through said hard mask layer in said second region of said pad stack, thereby forming a first topography in said hard mask layer whereby an upper surface of said first region is higher than an upper surface of said second region within said hard mask layer;

removing said block mask; and creating a device feature, including etching, as a second etching step, in said first region to create a trench in said semiconductor substrate, a presence of said first topography prior to said second etching step reducing, after said second etching step, a height differential between said upper surface of said first region and said upper surface of said second region in said pad stack, said height differential would have been present had said second etching step been performed without first performing said first etching step, said height differential being caused by said second etching step having a tendency to etch faster through said first region than through said second region, depositing polysilicon into said trench and above said hard mask layer after said second etch step, and performing chemical mechanical polish (CMP) on said polysilicon to expose said hard mask layer.

\* \* \* \* \*